(12) United States Patent
Lovell et al.

(10) Patent No.: US 7,921,916 B2
(45) Date of Patent: Apr. 12, 2011

(54) COMMUNICATING MEASUREMENT DATA FROM A WELL

(75) Inventors: John R. Lovell, Houston, TX (US); Christian Chouzenoux, St. Cloud (FR); Christophe Champagnon, Meylan (FR); Ashish Chaudhary, Edmonton (CA)

(73) Assignee: Schlumberger Technology Corporation, Sugar Land, TX (US)

( * ) Notice: Subject to any disclaimer, the term of this patent is extended or adjusted under 35 U.S.C. 154(b) by 505 days.

(21) Appl. No.: 11/945,126

(22) Filed: Nov. 26, 2007

(65) Prior Publication Data
US 2008/0236837 A1 Oct. 2, 2008

Related U.S. Application Data

(60) Provisional application No. 60/909,001, filed on Mar. 30, 2007.

(51) Int. Cl.
*E21B 47/00* (2006.01)
(52) U.S. Cl. ... 166/336; 166/352; 166/368; 166/250.01; 73/152.01; 340/853.1; 702/6
(58) Field of Classification Search .............. 166/336, 166/351, 352, 368, 250.01, 66; 73/152.01; 340/853.1; 702/6
See application file for complete search history.

(56) References Cited

U.S. PATENT DOCUMENTS

| | | | |
|---|---|---|---|
| 5,604,824 A * | 2/1997 | Chui et al. | 382/248 |
| 5,684,693 A * | 11/1997 | Li | 702/6 |
| 6,192,988 B1 * | 2/2001 | Tubel | 166/313 |
| 6,347,283 B1 * | 2/2002 | Soliman et al. | 702/6 |
| 6,369,718 B1 * | 4/2002 | Mathieu | 340/853.7 |
| 6,374,913 B1 * | 4/2002 | Robbins et al. | 166/66 |
| 6,725,924 B2 * | 4/2004 | Davidson et al. | 166/250.01 |
| 6,866,306 B2 * | 3/2005 | Boyle et al. | 285/333 |
| 6,880,634 B2 * | 4/2005 | Gardner et al. | 166/250.01 |
| 6,998,724 B2 * | 2/2006 | Johansen et al. | 290/1 R |
| 7,126,492 B2 * | 10/2006 | Wisler et al. | 340/854.3 |
| 7,132,958 B2 * | 11/2006 | Dodge et al. | 340/854.3 |
| 7,187,620 B2 * | 3/2007 | Nutt et al. | 367/25 |
| 7,261,162 B2 * | 8/2007 | Deans et al. | 166/336 |
| 7,275,597 B2 * | 10/2007 | Hall et al. | 166/297 |
| 7,301,429 B1 * | 11/2007 | Hall et al. | 336/192 |
| 7,303,007 B2 * | 12/2007 | Konschuh et al. | 166/250.01 |
| 7,453,768 B2 * | 11/2008 | Hall et al. | 367/82 |
| 7,464,770 B2 * | 12/2008 | Jones et al. | 175/25 |
| 7,518,949 B2 * | 4/2009 | Haugland | 367/31 |
| 2004/0262008 A1 * | 12/2004 | Deans et al. | 166/339 |

(Continued)

FOREIGN PATENT DOCUMENTS

EP 943782 A2 9/1999

(Continued)

*Primary Examiner* — Thomas A Beach
*Assistant Examiner* — Matthew R Buck
(74) *Attorney, Agent, or Firm* — Trop, Pruner & Hu, P.C.; Brandon S. Clark; Rodney V. Warfford

(57) ABSTRACT

To communicate measurement data from a well, data corresponding to measurement data collected by multiple sensors in a well is transformed downhole and passed to an intermediate communications device, which device in turn passes a subset of that data to a destination communications device. The destination communications device applies a second transformation to the data received from the intermediate communications device. The first and second transformations are designed such that meaningful data can be recovered at the destination communications device even though only a subset of the original transformed data has been received.

22 Claims, 2 Drawing Sheets

U.S. PATENT DOCUMENTS

| | | | |
|---|---|---|---|
| 2005/0035874 A1* | 2/2005 | Hall et al. | 340/853.1 |
| 2005/0046586 A1* | 3/2005 | Hall et al. | 340/853.4 |
| 2005/0285751 A1* | 12/2005 | Hall et al. | 340/853.1 |
| 2007/0198192 A1* | 8/2007 | Hsu et al. | 702/6 |
| 2007/0223822 A1* | 9/2007 | Haugland | 382/232 |
| 2007/0227727 A1* | 10/2007 | Patel et al. | 166/250.01 |
| 2007/0272442 A1* | 11/2007 | Pastusek et al. | 175/40 |
| 2008/0060847 A1* | 3/2008 | Konschuh et al. | 175/40 |
| 2008/0068209 A1* | 3/2008 | Sugiyama et al. | 340/853.2 |

FOREIGN PATENT DOCUMENTS

| | | |
|---|---|---|
| EP | 943782 A3 | 9/2001 |
| GB | 2307380 A | 5/1997 |
| GB | 2367133 A | 3/2002 |
| GB | 2403292 A | 12/2004 |
| GB | 2405509 A | 3/2005 |
| GB | 2406238 A | 3/2005 |
| GB | 2436579 A | 10/2007 |

\* cited by examiner

COMMUNICATING MEASUREMENT DATA FROM A WELL

TECHNICAL FIELD

The invention relates generally to communicating measurement data from a well.

BACKGROUND

To produce fluids from or to inject fluids into a well, various completion equipment can be provided into the well, such as tubings, packers, flow control devices, sensors, and so forth. The sensors deployed in a well are used to measure various parameters associated with fluids in the well or with the surrounding reservoir.

The measurement data is then communicated over some type of a telemetry system to surface equipment. The telemetry system can be especially complicated in a subsea environment, where data transmission has to pass through a subsea tree to be routed to surface equipment. In many cases, a lossy telemetry stage is used at the subsea interface, wherein data is discarded if it satisfies certain parameters. For example if a change of pressure is less than some predetermined threshold then the new pressure data might not be transmitted but instead discarded. Conventionally, presence of such a lossy telemetry stage prevents use of encryption and compression. In implementations that involve a relatively large number of sensors, the amount of measurement data can be relatively large, and consequently more data may be discarded at the subsea interface. Bandwidth constraints on conventional telemetry systems can prevent timely communication of measurement data to surface equipment, which leads to a desire to compress the data before it is transmitted. Also, in some scenarios, maintaining security of measurement data can be a concern, in which case an encryption algorithm may be employed. Conventionally, however, use of a lossy telemetry stage will prevent application of compression or encryption as discussed above.

SUMMARY

In general, a method of communicating measurement data from a well includes applying transformation to measurement data collected by sensors in the well, transmitting the transformed data through a subsea telemetry system that applies a lossy compression algorithm and then retransforming the data back into meaningful values. The applied transformation may include data compression or encryption.

Other or alternative features will become apparent from the following description, from the drawings, and from the claims.

DETAILED DESCRIPTION

Figure 1:
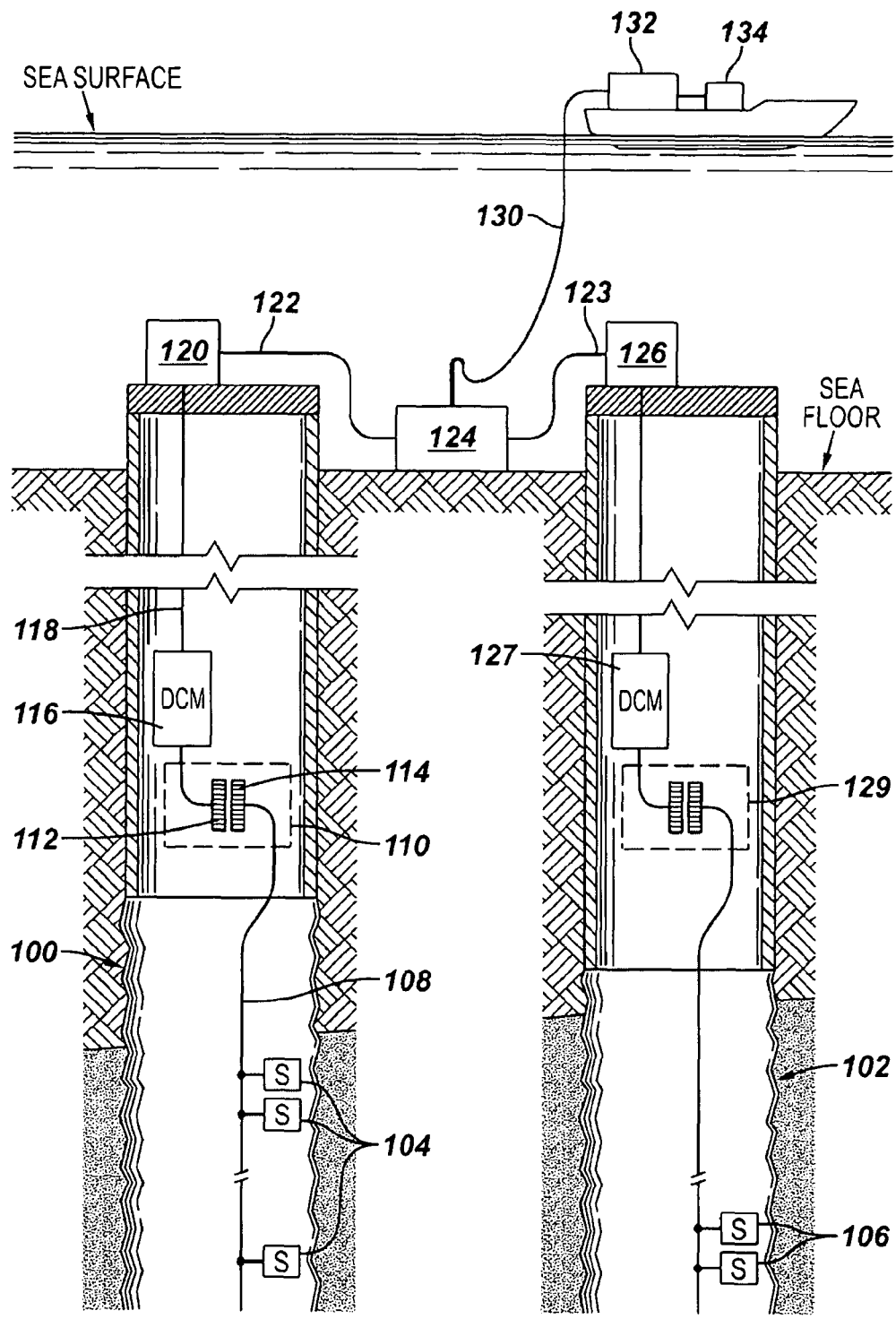
FIG. 1 illustrates an example arrangement that includes sensors and a telemetry system, according to an embodiment.

In the following description, numerous details are set forth to provide an understanding of the present invention. However, it will be understood by those skilled in the art that the present invention may be practiced without these details and that numerous variations or modifications from the described embodiments are possible.

As used here, the terms "above" and "below;" "up" and "down;" "upper" and "lower;" "upwardly" and "downwardly;" and other like terms indicating relative positions above or below a given point or element are used in this description to more clearly describe some embodiments of the invention. However, when applied to equipment and methods for use in wells that are deviated or horizontal, such terms may refer to a left to right, right to left, or diagonal relationship as appropriate.

In accordance with some embodiments, transformed data is sent from downhole sensors in a well to an intermediate communications device. The transformation may be compression of the data from a sensor, joint compression of data from multiple sensors, or encryption of the data. The intermediate communications device has a lossy compression stage that employs a lossy compression algorithm in which not all of the received measurement data is forwarded to a destination communications device. The lossy compression algorithm allows for more efficient use of bandwidth between the intermediate communications device and the destination communications device. The intermediate communications device has the characteristic, however, that because not all of the data received by the intermediate communications device is forwarded, it is generally not possible to retransform the data back to meaningful or interpretable values at the destination (e.g., at surface equipment) using conventional techniques.

In one embodiment, the transformation applied is encryption. This is of benefit because the proprietary nature of the measurement data can be maintained, which is desirable if the intermediate communications device is being managed by a different entity than the entity that is operating the downhole sensors and destination communications device. For example, a first company may be the provider of the downhole sensors and the destination communications device, while a second company (different from the first company) is the provider of the intermediate communications device. The lossy characteristic of the intermediate communications device might cause the loss of sufficiently many bits of data that conventional encryption/decryption techniques cannot be used.

To protect the proprietary nature of the measurement data as it passes through the intermediate communications device, the measurement data is encrypted. However, even though the measurement data is encrypted, the intermediate communications device still has to be able to apply its lossy compression algorithm. In accordance with some embodiments, the encryption of the measurement data is according to an algorithm that allows for the application of such lossy compression algorithm at the intermediate communications device.

In another embodiment, the transformation applied is data compression. In the case that a large number of sensors are deployed across a wellbore, then there will be much similarity between the data from one sensor to the next. This provides significant opportunities for data compression. For example, in the case that each sensor uses 32 bits of data, it may be possible to instead use 32 bits to send the average value of the sensors, and use only 8 bits of data to send the difference between each sensor and the average. Or more sophisticated transformations may be used, in which the Fourier transform of the array data is taken, and a certain number of bits are assigned to each of the transformed variables, with fewer bits used for the highest order Fourier transforms. Such compression can be done in a lossless fashion.

FIG. 1 illustrates an example arrangement that includes sensors provided in multiple wellbores, where two wellbores 100 and 102 are depicted in FIG. 1. In other examples, sensors can be provided in just one wellbore, or in more than two wellbores. Sensors 104 are provided in the first wellbore 100, and sensors 106 are provided in the second wellbore 102. The sensors 104, 106 may be provided in a sand face completion. Alternatively, sensors can be arranged as an array along a reservoir section of the well.

Examples of sensors 104 and 106 include temperature sensors, pressure sensors, flow rate sensors, and/or sensors to measure various other parameters associated with the wellbores 100, 102, and/or surrounding reservoirs.

The sensors 104 are interconnected over a cable 108 (e.g., electrical cable or fiber optic cable) to an inductive coupler 110 that has a first inductive coupler portion 112 for mating with a second inductive coupler portion 114. Use of the inductive coupler 110 allows for the inductive coupler portion 114 and sensors 104 to be first deployed as part of a lower completion system, with an upper completion system including the mating inductive coupler portion 112 to be lowered at a later time. The inductive coupler portions 112 and 114 allow for electrical communication between different completion systems installed at different times. In alternative implementations, other types of communications mechanisms can be used, including electromagnetic communication mechanisms, acoustic communication mechanisms, pressure pulse communication mechanisms, wired communication mechanisms, optical communication mechanisms, and so forth.

The inductive coupler portion 112 is electrically connected to a downhole control module 116, which can include a telemetry interface for communicating over an electrical cable 118 to an earth surface location. In one example, the electrical cable 118 is a twisted pair cable. In other examples, other types of electrical cables can be used. In yet further examples, the cable 118 can be a fiber optic cable rather than an electrical cable.

The cable 118 is connected to a converter 120, which can be located at an earth surface location. In a subsea environment, the converter 120 can be part of subsea wellhead equipment provided at a sea floor. The converter 120 converts between the communications protocol used on the cable 118 (which can be any type of communications protocol, including proprietary communications protocols used by different well operators), and an open communications protocol used on a communications channel 122 between the converter 120 and a communications module 124. One example of such an open communications protocol is a Transmission Control Protocol/Internet Protocol (TCP/IP). Other communications protocols can be used in other embodiments. An "open" communications protocol is a protocol that is not a proprietary protocol.

In a subsea application, the communications module 124 can be a subsea communications module that is deployed somewhere in a body of water or at the sea floor. Note that although reference is made to subsea applications, it is noted that techniques according to some embodiments can also be applied to land-based communications arrangements.

The subsea communications module 124 can receive data from other sources, including a second converter 126 that is electrically coupled to the sensors 106 in the second wellbore 102 through a downhole control module 127 and inductive coupler 129. The subsea communications module 124 receives measurement data from multiple sources and assembles the measurement data for communication over another communications channel 130 to a destination communications device 132. In one example, the communications channel 130 can be part of an umbilical provided between subsea equipment and sea surface equipment.

In a subsea application, the destination communications device 132 is a surface (e.g., sea surface) controller, such as a surface controller provided on a sea vessel or a sea platform. Alternatively, the destination communications device 132 can be remotely located on land, where transmission from the subsea communications module 124 to the destination communications device can include communications over a wireless link, such as a satellite link, cellular link, and so forth.

The communications module 124, or a combination of the communications module 124 and converter 120, can be considered an example of the "intermediate communications device" mentioned above. The intermediate communications device may be operated by a third party such that security associated with communication of measurement data from the sensors (104, 106) that pass through the intermediate communications device to the destination communications device 132 would be desirable.

As further depicted in FIG. 1, the destination communications device 132 is coupled to a computer 134 to allow for a user to access data that is received by the destination communications device 132. A user at the computer 134 can also configure various components along the chain of the communications arrangement in FIG. 1.

The subsea communications module 124 can apply a lossy compression algorithm in which less than all of the received measurement data is communicated over the communications channel 130 to the destination communications device 132. Note that because the subsea communications module 124 is coupled to multiple sources of measurement data, the amount of measurement data that is received at the subsea communications module 124 can be relatively large. The communications channel 130 can have bandwidth constraints that may prevent timely communication of all received measurement data from the subsea communications module 124 to the destination communications device 132. The lossy compression algorithm conserves the bandwidth of the communications channel 130 by communicating just a portion of all received measurement data to the destination communications device 132.

In some embodiments, for security purposes, the measurement data received at the subsea communications module 124 may include encrypted measurement data. As noted above, the subsea communications module 124 can actually be operated by an entity that is different from the entity that operates the components in the wellbores 100 and 102, as well as the destination communications device 132. To prevent the operator of the subsea communications module 124 from understanding the proprietary measurement data, the measurement data is encrypted, such as by the downhole control module 116 or 127 provided in the wellbore 100 or 102. However, in accordance with some embodiments, the encryption applied by the downhole control module 116 or 127 (or by the converter 120 or 126) does not prevent the application of the lossy compression algorithm by the subsea communications module 124.

The lossy compression algorithm applied by the subsea communications module 124 can include an algorithm in which data is communicated only if the data has changed from a prior version of the data by at least some threshold amount (i.e., the current version of the measurement data is less than or greater than the prior version of the measurement data by more than the threshold amount). For example, if the measurement data includes temperature data, then a current version of the temperature data is transmitted by the subsea communications module 124 over the communications channel 130 to the destination communications device 132 only if the current version of the temperature data differs from the prior version of the temperature data by more than a threshold temperature difference. By applying such lossy compression algorithm, the amount of traffic that is communicated over the communications channel 130 from the subsea communications module 124 to the destination communications device 132 is reduced.

As noted above, an open communications protocol, such as TCP/IP, is used over the channel 122, 123 between the converter 120, 126 and the subsea communications module 124. An issue associated with the open communications protocol employed over the channel 122, 123 is that protocol headers have to be added to each packet communicated between the converter 120, 126 and subsea communications module 124. If the open communications protocol is the TCP/IP protocol, then the headers added include TCP and IP headers, as well as any headers from higher level layers of the communications protocol. Thus, if the measurement data from individual sensors is sent in individual packets, the overhead can be quite large, since there would be many packets with corresponding overhead headers communicating traffic from individual sensors over each communications channel 122, 123.

Although the converters 120, 126 are provided in the depicted implementation, note that the converters 120, 126 can be omitted in other implementations. In such other implementations, the downhole control modules 116, 127 can communicate packets according to an open communications protocol to the subsea communications module 124.

To reduce the amount of overhead in the form of packet headers, measurement data from multiple sensors can be assembled into larger blocks, such that each block can include measurement data from multiple sensors. Thus, rather than assemble measurement data from individual sensors in packets, the blocks representing measurement data of multiple sensors are assembled into packets. However, an issue associated with communicating measurement data from different sensors in large blocks is that the lossy compression algorithm applied by the subsea communications module 124 may be made less effective.

To address this issue, in accordance with some embodiments, sensors in a well can be divided into banks (or other groups), with measurement data from each bank forming a data block. Thus, each bank includes N sensors, where $N \geq 2$. The number of sensors in a bank can be selected by a well operator based on analyzing the overhead burden versus effective application of the lossy compression algorithm by the subsea communications module 124.

It is noted that one or more banks can be disabled, such as when some fault (e.g., an electrical short or a current surge) is present in the bank. The converter 120 or 126 can stop polling for data from a particular bank if the converter senses that the bank has been disabled. Alternatively, the converter can continue to poll disabled banks, with the downhole control module 116 transmitting zeros for such disabled bank. Since the data block associated with a disabled bank would include just zeros, it is noted that when the subsea communications module 124 decides whether or not to send a particular data block associated with the disabled bank, the subsea communications module 124 will detect that the current version of the data block (which contains zeros) will not have changed from a previous version of the data block (which also contains zeros); as a result, according to the lossy compression algorithm, the subsea communications module 124 would not forward the data block of the disabled bank to the destination communications device 132.

Also, in accordance with some embodiments, encryption of the measurement data associated with each bank of sensors can be performed in the following manner. The encryption can be performed by the downhole control module 116, 127, or by the converter 120, 126. Assume there are N sensors in a bank, where each measurement data from a particular sensor has M bits, M>1. Then, the most significant bits of corresponding measurement data from the N sensors of the bank can be collected into a first block. The next most significant bits of the respective measurement data from the N sensors are collected into a second block. This process continues for each bit of measurement data from respective sensors. Effectively, according to the encryption algorithm of one embodiment the measurement data of each sensor in a bank is divided into individual bits, with different individual bits of the measurement data of each sensor provided into different corresponding blocks. Each block includes a group of bits from multiple sensors of the bank.

Figure 2:
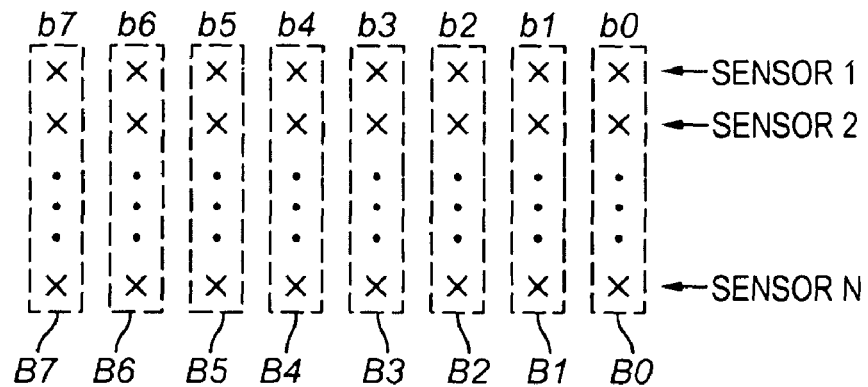
FIG. 2 illustrates an encryption algorithm, according to an embodiment.

FIG. 2 shows an example implementation, where each measurement data is assumed to be a byte that includes eight bits: b0, b1, b2, b3, b4, b5, b6, and b7, where b0 is the least significant bit and b7 is the most significant bit. Also, FIG. 2 shows N measurement data bytes from N sensors (sensor 1, sensor 2, . . . sensor N). The encryption algorithm takes the most significant bits b7 from the N measurement data bytes and collects them into a block, referred to as B7. Thus, bit b7 from sensor 1, bit b7 from sensor 2, and so forth up to bit b7 from sensor N, is collected into the block B7. Similarly, the encryption algorithm collects the b6 bits from the measurement data bytes of the N sensors into a block B6. The same is repeated for the other bits of the measurement data bytes from the N sensors for collection into blocks B5, B4, B3, B2, B1, and B0. These are the blocks that are communicated to the subsea communications module 124.

In the lossy compression algorithm applied by the subsea communications module 124, it is noted that it is generally unlikely for a current version of block B7 (containing the most significant bits of measurement data from multiple sensors) to differ from a prior version of the block B7, since it is unlikely for measurement data to differ significantly, particularly if the measurement data is being communicated at relatively short time intervals. Consequently, it is unlikely that the subsea communications module 124 will detect that the most significant block B7 will differ from a previous version by more than the threshold amount; therefore, the subsea communications module 124, in applying its lossy compression algorithm, will usually not forward block B7 to the destination communications device 132 over the communications channel 130 (FIG. 1). On the other hand, it is likely that block B0 (the block containing the least significant bits of measurement data from the N sensors) will differ by greater than the threshold amount from a previous version; therefore, it is likely that block B0 will be forwarded to the destination communications device 132.

Since the encryption of the measurement data is achieved by communicating individual bits from corresponding measurement data of respective sensors in different blocks, from the perspective of the subsea communications module 124, the data is practically meaningless (since the subsea communications module 124 is unaware of the specific encryption algorithm used). Each block B0-B7 does not include any meaningful data from any individual sensor. However, even though the data is encrypted, the subsea communications module 127 is still able to apply its lossy compression algorithm.

At the receiving end (e.g., destination communications device 132 or computer 134), the blocks received from the subsea communications module 124 can be re-assembled into meaningful measurement data bytes for analysis. "Meaningful" data refers to data that can be understood by a user or a software program. Note that the blocks not transmitted by the subsea communications module 124 due to application of the lossy compression algorithm are present at the destination communications device 132 since such blocks have not changed.

In a different embodiment, instead of collecting individual bits into respective blocks, it is noted that two or more bits of measurement data from each sensor can be collected into corresponding blocks. In another example, two bits from each measurement data byte of the multiple sensors can be collected into blocks. Thus, in this example, the b0 and b1 bits from the measurement data of the N sensors can be collected into one block, the b2 and b3 bits of the measurement data of the N sensors can be collected into another block, and so forth. Thus, generally, the encryption performed according some embodiments is to divide each measurement data of a particular sensor into multiple portions (where each portion includes one bit or multiple bits), and to provide individual portions from respective measurement data of the N sensors into a corresponding block.

In other embodiments, other types of transformation algorithms can be applied by the converters 120, 126, or by downhole control modules 116, 127, or even by the sensors. For example, the transformation can be based on Haar transformation, which is a particular type of wavelet transformation. The transformation takes an array of data and converts the data into the part that changes the most frequently and the part that changes less frequently. The part that changes most frequently is provided in one block, and the part that changes less frequently is provided in another block. As noted above, the transformation applied can alternatively be a compression algorithm applied on measurement data from the sensors.

In general, such a transformation algorithm performed seeks to keep slowly varying data together in blocks and to keep more rapidly varying data in other blocks, such that the lossy compression algorithm applied by the intermediate communications device can be enhanced.

In yet further embodiments, to reduce the amount of data that is actually communicated to the subsea communications module, the sensors can omit to send some number of the most significant bits of each measurement data. The most significant bits of data may be irrelevant when the well operator is interested in detecting drift of temperature measurements. Also, some number of the least significant bits may be irrelevant for drift analysis. Multiple measurement data from the same sensor can be averaged over some time interval, which effectively removes the need to save the lowest order bits. By removing some number of the most significant bits and some number of the least significant bits, the amount of data that is actually sent can be further reduced.

Figure 3:
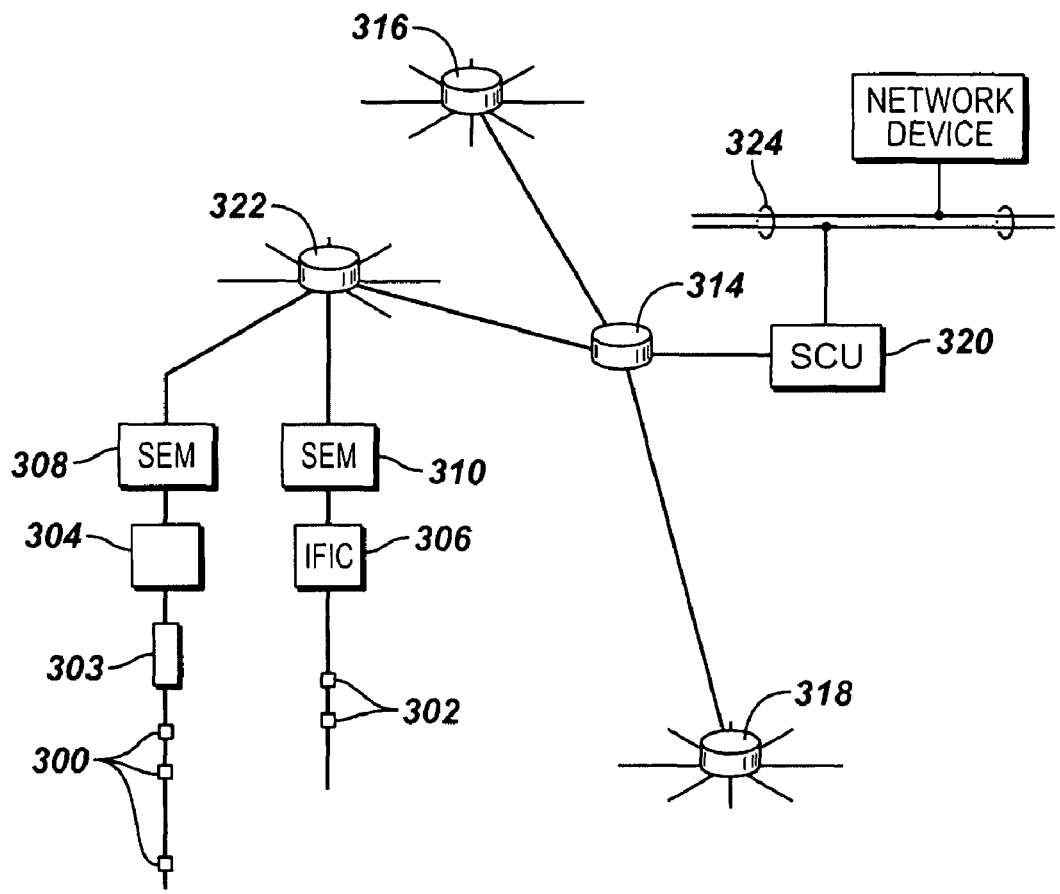
FIG. 3 illustrates an example arrangement that includes sensors and a telemetry system, according to another embodiment.

FIG. 3 shows an alternative arrangement according to another embodiment to allow for communication of measurement data to a destination communications device. In the FIG. 3 arrangement, measurement data from sensors 300 and sensors 302 in different wells are provided through respective converters 304, 306 to respective subsea communications modules 308, 310. Note that the data from sensors 300 are provided through a downhole control module 303 to the converter 304. The converters 304 and 306 can apply an encryption as discussed above, and the subsea communications modules 308 and 310 can apply the lossy compression algorithm discussed above.

Data from the subsea communications modules 308 and 310 are passed to a subsea module (SM) 322, which can also receive data from other sources. The SM 322 can pass data to another electronic module 314, which can receive data from other SMs 316 and 318. The electronic module 314 is connected to a surface control unit 320, which can be considered the destination communications device in this implementation. The surface control unit 320 can be connected to other devices over a network 324, such as an Ethernet network or some other type of network.

The transformation and lossy compression algorithms discussed above can be performed by hardware or by a combination of software and hardware. Instructions of the software can be loaded for execution on a processor. The processor can include microprocessors, microcontrollers, processor modules or subsystems (including one or more microprocessors or microcontrollers), or other control or computing devices. A "processor" can refer to a single component or to plural components.

Data and instructions (of the software) can be stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While the invention has been disclosed with respect to a limited number of embodiments, those skilled in the art, having the benefit of this disclosure, will appreciate numerous modifications and variations therefrom. It is intended that the appended claims cover such modifications and variations as fall within the true spirit and scope of the invention.

What is claimed is:

1. A method for communicating measurement data from a well, comprising:

applying a downhole transformation to measurement data collected by sensors in the well, wherein applying the downhole transformation comprises converting the measurement data collected by the sensors into blocks, where at least one of the blocks contains portions of the measurement data that are expected to vary more than portions of the measurement data contained in at least another of the blocks;

passing the transformed measurement data through an intermediate communications device that applies a lossy compression algorithm on the blocks;

transforming data received from the intermediate communications device based on application of the lossy compression algorithm on the blocks so as to produce meaningful data at a destination communications device; wherein:

applying the lossy compression algorithm comprises forwarding only blocks of the transformed measurement data that have changed by at least a predetermined threshold amount with respect to the prior corresponding versions of the blocks containing respective portions of prior measurement data from sensors; and transforming the received data comprises identifying blocks of the measurement data not transmitted by the intermediate communications device; and using prior versions of the identified blocks already present at the destination communications device to produce the meaningful data.

2. The method of claim 1, wherein converting the measurement data into blocks comprises converting the measurement data into a first block that contains a first group of bits from the measurement data of the sensors, and another block that contains a second group of bits from the measurement data of the sensors.

3. The method of claim 1, wherein applying the downhole transformation comprises encrypting the measurement data from the sensors, and wherein transforming the data received from the intermediate communications device comprises decrypting the data received from the intermediate communications device.

4. The method of claim 1, wherein the intermediate communications device applies the lossy compression algorithm by transmitting only a subset less than all of the blocks.

5. The method of claim 1, wherein passing the transformed measurement data through the intermediate communications device comprises passing the transformed measurement data through a subsea communications module.

6. The method of claim 5, further comprising the destination communications device receiving the data from the subsea communications module, wherein the destination communications device comprises a surface communications device.

7. The method of claim 1, further comprising:
receiving, by the intermediate communications device, additional transformed measurement data corresponding to measurement data collected by sensors in a second well; and
checking, by the intermediate communications device, for portions of the additional transformed measurement data to forward to the destination communications device according to whether the portions of the additional transformed measurement data have changed by at least a threshold amount.

8. The method of claim 1, further comprising receiving the measurement data using wireless communications components in the well.

9. The method of claim 1, further comprising receiving the measurement data from the sensors that are arranged as an array of sensors disposed along a reservoir section of the well, wherein the downhole transformation of measurement data is applied for the array of sensors.

10. The method of claim 1, further comprising:
discarding at least another of the blocks of the transformed measurement data that has changed by less than the predetermined threshold amount with respect to a prior corresponding version of the another block containing a respective portion of prior measurement data from the sensors.

11. The method of claim 1, wherein the measurement data of each sensor has plural bits, wherein the plural bits are divided into multiple segments for provision into corresponding different ones of the blocks.

12. The method of claim 11, wherein each of the multiple segments is a single bit of the measurement data of the corresponding sensor.

13. The method of claim 11, wherein each of the multiple segments is a group of bits of the measurement data of the corresponding sensor, and wherein each group of bits has a number of bits less than a total number of the plural bits of the measurement data of the corresponding sensor.

14. A system comprising:
sensors for deployment in a well;
a first module to receive measurement data from the sensors and to transform first portions of the measurement data from the sensors into a first block and to transform second portions of the measurement data from the sensors into a second block;
an intermediate communications device to receive the first and second blocks from the first module and to apply a lossy compression algorithm on the blocks, wherein the lossy compression algorithm selects one of the blocks to not send to a destination communications device, wherein the first block has data that is expected to vary at a slower rate than data in the second block, wherein the selected one of the first and second blocks that is not sent to the destination communications device is the block where data has varied from a previous version of the block by less than a threshold amount; and
the destination communications device, wherein the destination communications device is configured to:
receive data from the intermediate communications device based on application of the lossy compression algorithm, wherein the received data includes one of the first and second blocks sent by the intermediate communications device; and
identify the one of the first and second blocks not sent by the intermediate communications device due to application of the lossy compression algorithm; and
use a prior version of the identified block already present at the destination communications device to produce meaningful data for use at the destination communications device, wherein the prior version of the identified block is combined with the one of the first and second blocks contained in the received data to produce the meaningful data.

15. The system of claim 14, wherein the intermediate communications device comprises a subsea communications module.

16. The system of claim 14, wherein the transformation applied by the first module further transforms third portions of the measurement data from the sensors into a third block, wherein the intermediate communications device is configured to receive the first, second, and third blocks from the first module and to apply the lossy compression algorithm on the received blocks, wherein the lossy compression algorithm selects at least one of the first, second, and third blocks to not send to the destination communications device.

17. The system of claim 14, further comprising additional sensors for deployment in a second well; and
a second module to receive measurement data from the additional sensors in the second well and to transform first portions of the measurement data from the additional sensors into a third block, and to transform second portions of the measurement data from the additional sensors into a fourth block, and
wherein the intermediate communications device is to receive the third and fourth blocks from the second module and to apply the lossy compression algorithm on the third and fourth blocks to select one of the third and fourth blocks to not send to the destination communications device, and wherein the selected one of the third and fourth blocks that is not sent to the destination communications device has varied from a previous version of the corresponding block by less than the threshold amount.

18. The system of claim 14, further comprising an inductive coupler to communicate the measurement data from the sensors to the first module.

19. The system of claim 18, further comprising a downhole control module for deployment in the well, wherein the downhole control module is connected between the inductive coupler and the first module.

20. The system of claim 14, further comprising a wireless telemetry stage to communicate the measurement data from the sensors to the first module.

21. The system of claim 14, wherein the lossy compression algorithm selects another one of the first and second blocks to send to the destination communications device, wherein the selected another one of the first and second blocks is the block where data has varied from a previous version of the corresponding block by at least the threshold amount.

22. The system of claim 14, wherein the measurement data of each sensor has plural bits, and wherein each of the first and second portions includes a corresponding different group of the plural bits.

* * * * *